(12) United States Patent
Nagle et al.

(10) Patent No.: US 11,789,074 B2
(45) Date of Patent: Oct. 17, 2023

(54) PARAMETER SPACE REDUCTION FOR DEVICE TESTING

(71) Applicant: National Instruments Corporation, Austin, TX (US)

(72) Inventors: James C. Nagle, Leander, TX (US); Stephen Thung, Norman, OK (US); Sergey Kizunov, Sunny Isles Beach, FL (US); Shaul Teplinsky, Orinda, CA (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 65 days.

(21) Appl. No.: 17/500,639

(22) Filed: Oct. 13, 2021

(65) Prior Publication Data

US 2023/0114555 A1 Apr. 13, 2023

(51) Int. Cl.
 *G01R 31/3177* (2006.01)
 *G01R 31/3183* (2006.01)
 (Continued)

(52) U.S. Cl.
 CPC ..... *G01R 31/3177* (2013.01); *G01R 31/2834* (2013.01); *G01R 31/2851* (2013.01); *G01R 31/3183* (2013.01); *G01R 31/318307* (2013.01); *G01R 31/318314* (2013.01); *G01R 31/318357* (2013.01); *G06F 17/16* (2013.01); *G06N 3/047* (2023.01)

(58) Field of Classification Search
 CPC ........ G01R 31/3177; G01R 31/318307; G01R 31/318314; G01R 31/318357; G01R 31/2851; G01R 31/2834; G06F 17/16; G06N 3/047

USPC .......... 714/724, 735, 741, 742, 745
See application file for complete search history.

(56) References Cited

U.S. PATENT DOCUMENTS

| | | | | |
|---|---|---|---|---|
| 2006/0117237 | A1* | 6/2006 | Weller | G06F 11/263 |
| | | | | 714/742 |
| 2007/0132477 | A1* | 6/2007 | Balog | G01R 31/3172 |
| | | | | 324/762.01 |

(Continued)

OTHER PUBLICATIONS

Yilmaz et al., Per-Device Adaptive Test for Analog/RF Circuits Using Entropy-Based Process Monitoring, Jun. 2013, IEEE, vol. 21, No. 6, pp. 1116-1128. (Year: 2013).*

(Continued)

*Primary Examiner* — John J Tabone, Jr.
(74) *Attorney, Agent, or Firm* — Kilpatrick Townsend & Stockton LLP

(57) ABSTRACT

Described herein are systems, methods, and other techniques for identifying redundant parameters and reducing parameters for testing a device. A set of test values and limits for a set of parameters are received. A set of simulated test values for the set of parameters are determined based on one or more probabilistic representations for the set of parameters. The one or more probabilistic representations are constructed based on the set of test values. A set of cumulative probabilities of passing for the set of parameters are calculated based on the set of simulated test values and the limits. A reduced set of parameters are determined from the set of parameters based on the set of cumulative probabilities of passing. The reduced set of parameters are deployed for testing the device.

20 Claims, 11 Drawing Sheets

(51) Int. Cl.
 *G01R 31/28* (2006.01)
 *G06F 17/16* (2006.01)
 *G06N 3/047* (2023.01)

(56) References Cited

U.S. PATENT DOCUMENTS

2008/0244326 A1\* 10/2008 Basu .................. G06F 11/24
 714/40
2012/0076395 A1\* 3/2012 Khurana ................ G06T 5/50
 382/145
2014/0172347 A1\* 6/2014 Gavish ................ G06F 30/33
 702/123
2020/0042434 A1\* 2/2020 Albertson ........... G06F 11/3676

OTHER PUBLICATIONS

Yilmaz et al., Adaptive Test Flow for Mixed-Signal/RF Circuits Using Learned Information from Device Under Test, 2010, IEEE, paper 23.1, pp. 1-10 (Year: 2010).\*
Yilmaz et al., Test Application for Analog/RF Circuits With Low Computational Burden, Jun. 2012, IEEE, vol. 31, No. 6,, pp. 968-979. (Year: 2012).\*
Pan et al., Test Generation for Linear Time-Invariant Analog Circuits, May 1999, IEEE, vol. 46, No. 5, pp. 554-564. (Year: 1999).\*

\* cited by examiner (Initial) Set of Parameters 512

| Param_1 | Param_2 | Param_3 | Param_4 | Param_5 |

FIG. 5A

Test values

| Param_1 | Param_2 | Param_3 | Param_4 | Param_5 |
|---------|---------|---------|---------|---------|
| 1.652   | -6.664  | -0.332  | 6.513   | 2.304   |
| 2.357   | -7.48   | -0.077  | 7.138   | 2.086   |
| -3.213  | -13.057 | -1.106  | 3.223   | -1.365  |
| 2.41    | 11.524  | -0.219  | 12.067  | 2.644   |
| 3.893   | -7.739  | 0.202   | 6.861   | 3.302   |
| 11.954  | -2.721  | 1.422   | 7.754   | 9.321   |
| 5.162   | -11.36  | 0.574   | 6.331   | 4.423   |
| 6.663   | 8.518   | 0.67    | 11.6    | 4.621   |
| -3.021  | -4.992  | -1.054  | 5.158   | -0.434  |
| 6.1     | -14.238 | 0.441   | 1.977   | 4.838   |

FIG. 5B

Upper limits

| Param_1 | Param_2 | Param_3 | Param_4 | Param_5 |
|---------|---------|---------|---------|---------|
| 5       | 0       | 1       | 10      | 4       |

FIG. 5C

Lower limits

| Param_1 | Param_2 | Param_3 | Param_4 | Param_5 |
|---------|---------|---------|---------|---------|
| 1       | -8      | -1      | 4       | 2       |

FIG. 5D

|  | Param_1 | Param_2 | Param_3 | Param_4 | Param_5 |
|---|---|---|---|---|---|
| Normalized test values | -0.674 | -0.666 | -0.332 | -0.162 | -0.696 |
| | -0.322 | -0.87 | -0.077 | 0.046 | -0.914 |
| | -3.106 | -2.264 | -1.106 | -1.259 | -4.365 |
| | -0.295 | 3.881 | -0.219 | 1.689 | -0.356 |
| | 0.446 | -0.935 | 0.202 | -0.046 | 0.302 |
| | 4.477 | 0.32 | 1.422 | 0.251 | 6.321 |
| | 1.081 | -1.84 | 0.574 | -0.223 | 1.423 |
| | 1.832 | 3.129 | 0.67 | 1.533 | 1.621 |
| | -3.011 | -0.248 | -1.054 | -0.614 | -3.434 |
| | 1.55 | -2.56 | 0.441 | -1.674 | 1.838 |

FIG. 5E

|  | Param_1 | Param_2 | Param_3 | Param_4 | Param_5 |
|---|---|---|---|---|---|
| Means | 0.198 | -0.205 | 0.052 | -0.046 | 0.174 |

FIG. 5F

|  | Param_1 | Param_2 | Param_3 | Param_4 | Param_5 |
|---|---|---|---|---|---|
| Variances | 5.126 | 4.637 | 0.612 | 1.121 | 8.896 |

FIG. 5G

|  | Param_1 | Param_2 | Param_3 | Param_4 | Param_5 |
|---|---|---|---|---|---|
| Univariate probabilities of passing | 0.34 | 0.356 | 0.798 | 0.655 | 0.262 |

FIG. 5H

| Param_5 | Param_1 | Param_2 | Param_4 | Param_3 |
|---|---|---|---|---|

FIG. 5I

Covariances

| Param_1 | Param_2 | Param_3 | Param_4 | Param_5 |
|---|---|---|---|---|
| 5.126 | 0.951 | 1.756 | 0.725 | 6.69 |
| 0.951 | 4.637 | 0.276 | 2.128 | 1.162 |
| 1.756 | 0.276 | 0.612 | 0.25 | 2.277 |
| 0.725 | 2.128 | 0.25 | 1.121 | 0.869 |
| 6.69 | 1.162 | 2.277 | 0.869 | 8.896 |

FIG. 5J

Simulated test values (forming simulated vectors)

| Param_5 | Param_1 | Param_2 | Param_4 | Param_3 |
|---|---|---|---|---|
| -0.334 | -0.024 | -0.097 | 0.198 | -0.013 |
| -0.439 | -0.281 | -3.272 | -1.056 | -0.096 |
| 2.319 | 1.373 | 0.4 | -0.441 | 0.198 |
| 2.126 | 1.715 | 1.448 | 0.623 | 0.602 |
| 1.097 | 0.781 | -2.816 | -1.489 | 0.284 |
| -0.217 | -0.357 | 1.359 | 0.39 | -0.205 |
| 3.033 | 2.473 | 0.922 | 0.467 | 0.824 |
| -1.193 | -0.688 | 0.964 | 0.281 | -0.176 |
| 4.207 | 3.632 | -2.633 | -0.629 | 1.367 |
| 1.203 | 1.686 | -3.16 | -0.913 | 0.816 |
| -1.414 | -0.767 | 2.063 | 0.87 | -0.384 |
| -0.772 | -0.678 | -1.488 | -0.287 | -0.227 |
| 0.893 | 0.986 | 2.228 | 1.754 | 0.451 |
| 1.288 | 1.437 | -3.439 | -1.078 | 0.459 |
| 0.24 | 0.209 | -1.789 | -0.375 | 0.263 |
| 3.725 | 3.054 | 1.895 | 1.355 | 1.212 |
| -0.446 | -0.548 | 0.965 | 0.48 | -0.323 |
| -1.524 | -1.102 | -1.997 | -0.425 | -0.172 |
| 1.746 | 1.063 | -3.221 | -1.434 | 0.361 |
| -2.589 | -2.303 | -1.192 | -0.639 | -0.929 |
| -0.792 | -0.89 | -2.58 | -1.118 | -0.254 |
| 3.897 | 2.615 | 1.907 | 1.547 | 0.937 |
| 1.92 | 1.536 | -0.031 | 0.047 | 0.549 |
| 2.76 | 2.412 | -2.679 | -0.94 | 0.962 |
| -1.676 | -1.569 | -2.518 | -0.989 | -0.535 |

FIG. 5K

| Param_5 | Param_1 | Param_2 | Param_4 | Param_3 |
|---|---|---|---|---|
| 1 | 1 | 1 | 1 | 1 |
| 1 | 1 | 0 | 0 | 0 |
| 0 | 0 | 0 | 0 | 0 |
| 0 | 0 | 0 | 0 | 0 |
| 0 | 0 | 0 | 0 | 0 |
| 1 | 1 | 0 | 0 | 0 |
| 0 | 0 | 0 | 0 | 0 |
| 0 | 0 | 0 | 0 | 0 |
| 0 | 0 | 0 | 0 | 0 |
| 0 | 0 | 0 | 0 | 0 |
| 0 | 0 | 0 | 0 | 0 |
| 1 | 1 | 0 | 0 | 0 |
| 1 | 1 | 0 | 0 | 0 |
| 0 | 0 | 0 | 0 | 0 |
| 1 | 1 | 0 | 0 | 0 |
| 0 | 0 | 0 | 0 | 0 |
| 1 | 1 | 1 | 1 | 1 |
| 0 | 0 | 0 | 0 | 0 |
| 0 | 0 | 0 | 0 | 0 |
| 0 | 0 | 0 | 0 | 0 |
| 1 | 1 | 0 | 0 | 0 |
| 0 | 0 | 0 | 0 | 0 |
| 0 | 0 | 0 | 0 | 0 |
| 0 | 0 | 0 | 0 | 0 |
| 0 | 0 | 0 | 0 | 0 |

Passing values (forming passing vectors)

FIG. 5L

| | Param_5 | Param_1 | Param_2 | Param_4 | Param_3 |
|---|---|---|---|---|---|
| Cumulative probabilities of passing | 0.32 | 0.32 | 0.08 | 0.08 | 0.08 |

FIG. 5M

| Incremental probabilities of passing | Param_5 | Param_1 | Param_2 | Param_4 | Param_3 |
|---|---|---|---|---|---|
| | | 0 | -0.24 | 0 | 0 |

FIG. 5N

| Redundant parameters | | Param_1 | | Param_4 | Param_3 |
|---|---|---|---|---|---|
| | | 0 | | 0 | 0 |

FIG. 5O

| Intermediate reduced set of parameters | Param_5 | | Param_2 | | |
|---|---|---|---|---|---|

FIG. 5P

| Intermediate reduced set of parameters | Param_5 | Param_2 |
|---|---|---|

FIG. 5Q

| Param_5 | Param_2 | Param_1 | Param_4 | Param_3 |
|---|---|---|---|---|

FIG. 5R

| Reduced set of parameters | Param_5 | Param_2 |
|---|---|---|

FIG. 5S

| Test Name | Train Size | Test Size | Full space | Reduced space | Space Improvement (Reduction %) |
|---|---|---|---|---|---|
| RX_ACCY_RX - [Xfer - TXtoPM + DigGain + TXtoRX] | 100 | 851 | 12878 | 1457 | 8.8x (88.7%) |
| RX Relative Accy (Norm Accy) | 100 | 1014 | 12878 | 1618 | 8.0x (87.4%) |
| RX_ACCY-IF_RX - [Xfer - TXtoPM + DigGain + TXtoRX] | 100 | 852 | 12718 | 1545 | 8.2x (87.9%) |
| RX-IF Relative Accy (Norm Accy) | 100 | 852 | 12718 | 1717 | 7.4x (86.5%) |
| TX_ACCY [RX+ Xfer-TXtoPM-TXpwr] (FULL) | 100 | 852 | 6771 | 514 | 13.2x (92.4%) |
| TX Relative Accy (Norm Accy) | 100 | 1015 | 6771 | 697 | 9.7x (89.7%) |
| TX_ACCY-IF [RX+ Xfer-TXtoPM-TXpwr] (FULL) | 100 | 852 | 6384 | 344 | 24.4x (94.6%) |
| TX-IF Relative Accy (Norm Accy) | 100 | 1017 | 6384 | 418 | 15.3x (93.5%) |
| TX Noise Floor (dBm/Hz) | 100 | 827 | 197 | 63 | 3.1x (68.0%) |
| TX Linearity IMD3 | 100 | 827 | 1322 | 480 | 2.8x (63.7%) |
| Phase Noise - TX | 100 | 827 | 22416 | 1853 | 12.1x (91.7%) |

FIG. 6

PARAMETER SPACE REDUCTION FOR DEVICE TESTING

BACKGROUND OF THE INVENTION

Before delivery to a customer, a manufactured product often undergoes testing to establish that the product is performing in accordance with a set of standards. Test operations involved in the manufacturing of electronic devices are commonly performed using commercial or custom Automated Test Equipment (ATE), often in conjunction with and under limited control of a test station host computer that provides management of manufacturing operations for one or more such ATE tools. The manufacturing test flow usually involves several test steps, some performed while electronic devices remain integrated on the surface of a single semiconductor wafer, and some performed on electronic devices after the wafer has been sawed into pieces consisting of singulated electronic devices. Sometimes, the singulated electronic devices are assembled into packages before testing is performed on the packaged electronic devices. Sometimes, the electronic devices are assembled into other electronic devices, e.g., boards or electronic modules, before testing is performed on the assembled electronic devices. Sometimes, the boards or modules are assembled into final electronic products before testing is performed on the final electronic devices.

The ATE (or "tester") can perform real-time control of the electronic test sequences and test conditions that are applied to the (electronic) devices-under-test (DUTs). This is enabled through a test program executing on one or more test site controller central processing units (CPUs), depending on system architecture, which control the pin electronics and power supplies that drive collections of test sites on the tester. Specification, for example, of the test content for the desired signal transition timing, voltage or current levels, pass/fail limit thresholds, vector/data sequences, test subroutine and pattern content, test flow branching, etc. is made through a combination of vector/pattern memory data files and compiled or linked test program files, created using custom tester-specific programming languages and a library of application programming interface (API) functions.

SUMMARY OF THE INVENTION

A summary of the various embodiments of the invention is provided below as a list of examples. As used below, any reference to a series of examples is to be understood as a reference to each of those examples disjunctively (e.g., "Examples 1-4" is to be understood as "Examples 1, 2, 3, or 4").

Example 1 is a computer-implemented method of reducing a set of parameters for testing a device, the computer-implemented method comprising: receiving a set of test values for the set of parameters, the set of test values having been obtained from testing a set of training devices; determining a set of simulated test values for the set of parameters based on one or more probabilistic representations for the set of parameters, the one or more probabilistic representations having been constructed based on the set of test values; calculating a set of cumulative probabilities of passing for the set of parameters based on the set of simulated test values; determining a reduced set of parameters from the set of parameters based on the set of cumulative probabilities of passing; and deploying the reduced set of parameters for testing the device.

Example 2 is the computer-implemented method of example(s) 1, further comprising: receiving limits for the set of parameters, wherein the limits include a lower limit and an upper limit for each of the set of parameters.

Example 3 is the computer-implemented method of example(s) 2, wherein the one or more probabilistic representations are constructed further based on the limits.

Example 4 is the computer-implemented method of example(s) 2, further comprising: normalizing the set of test values based on the limits.

Example 5 is the computer-implemented method of example(s) 4, wherein normalizing the set of test values includes modifying the set of test values to convert the lower limit to −1 and the upper limit to 1 for each of the set of parameters.

Example 6 is the computer-implemented method of example(s) 1, wherein the one or more probabilistic representations include a multivariate Gaussian distribution.

Example 7 is the computer-implemented method of example(s) 1, wherein a quantity of the set of simulated test values is greater than a quantity of the set of test values.

Example 8 is the computer-implemented method of example(s) 1, further comprising: calculating a set of incremental probabilities of passing for the set of parameters based on the set of cumulative probabilities of passing, wherein the reduced set of parameters is determined based on the set of incremental probabilities of passing.

Example 9 is the computer-implemented method of example(s) 8, wherein determining the reduced set of parameters includes arranging the set of parameters in descending or ascending order based on the incremental probabilities of passing.

Example 10 is a non-transitory computer-readable medium comprising instructions that, when executed by one or more processors, cause the one or more processors to perform operations comprising: receiving a set of test values for a set of parameters, the set of test values having been obtained from testing a set of training devices; determining a set of simulated test values for the set of parameters based on one or more probabilistic representations for the set of parameters, the one or more probabilistic representations having been constructed based on the set of test values; calculating a set of cumulative probabilities of passing for the set of parameters based on the set of simulated test values; determining a reduced set of parameters from the set of parameters based on the set of cumulative probabilities of passing; and deploying the reduced set of parameters for testing a device.

Example 11 is the non-transitory computer-readable medium of example(s) 10, wherein the operations further comprise: receiving limits for the set of parameters, wherein the limits include a lower limit and an upper limit for each of the set of parameters.

Example 12 is the non-transitory computer-readable medium of example(s) 11, wherein the one or more probabilistic representations are constructed further based on the limits.

Example 13 is the non-transitory computer-readable medium of example(s) 11, wherein the operations further comprise: normalizing the set of test values based on the limits.

Example 14 is the non-transitory computer-readable medium of example(s) 13, wherein normalizing the set of test values includes modifying the set of test values to convert the lower limit to −1 and the upper limit to 1 for each of the set of parameters.

Example 15 is the non-transitory computer-readable medium of example(s) 10, wherein the one or more probabilistic representations include a multivariate Gaussian distribution.

Example 16 is the non-transitory computer-readable medium of example(s) 10, wherein a quantity of the set of simulated test values is greater than a quantity of the set of test values.

Example 17 is the non-transitory computer-readable medium of example(s) 10, wherein the operations further comprise: calculating a set of incremental probabilities of passing for the set of parameters based on the set of cumulative probabilities of passing, wherein the reduced set of parameters is determined based on the set of incremental probabilities of passing.

Example 18 is the non-transitory computer-readable medium of example(s) 17, wherein determining the reduced set of parameters includes arranging the set of parameters in descending or ascending order based on the incremental probabilities of passing.

Example 19 is a computer-implemented method of determining that a parameter in a set of parameters for testing a device is redundant, the computer-implemented method comprising: receiving a set of test values for the set of parameters, the set of test values having been obtained from testing a set of training devices; determining a set of simulated test values for the set of parameters based on one or more probabilistic representations for the set of parameters, the one or more probabilistic representations having been constructed based on the set of test values; calculating a set of cumulative probabilities of passing for the set of parameters based on the set of simulated test values, the set of cumulative probabilities of passing including a first cumulative probability for the parameter and a second cumulative probability for a previous parameter that precedes the parameter in the set of parameters; calculating an incremental probability between the first cumulative probability and the second cumulative probability; and in response to determining that the incremental probability is below a threshold, determining that the parameter is redundant.

Example 20 is the computer-implemented of example(s) 19, further comprising: determining a reduced set of parameters from the set of parameters, the reduced set of parameters not including the parameter; and deploying the set of parameters for testing the device.

Example 21 is a method of determining that a parameter in position m in a set of parameters for testing a device is redundant, the method comprising: receiving test data for parameters from the set of parameters, comprising: receiving a set of test values for the parameters obtained from testing a plurality of devices; and receiving a set of one or more limits for the parameters; determining a set of simulated vectors containing simulated values for the parameters based on the set of test values; determining a set of passing vectors comprising passing values for the parameters; wherein a value in position i in a passing vector is set to pass when the simulated values in positions 1 through i in a corresponding simulated vector are within the respective one or more limits of the parameters 1 through i; determining a first cumulative probability of passing based on the passing values of a parameter in position m−1 and a second cumulative probability of passing based on the passing values of the parameter in position m; determining an incremental cumulative probability of passing for the parameter in position m as a delta between the second cumulative probability of passing and the first cumulative probability of passing; determining if the parameter in position m is redundant based on comparing the incremental cumulative probability of passing to a threshold; and removing the parameters in position m from the set of parameters if the parameter in position m is redundant; deploying the set of parameters for testing the device.

Example 22 is the method of example(s) 21, wherein the m is 2 or more.

Example 23 is the method of example(s) 21, wherein receiving the test data includes arranging the parameters in the set of parameters so an individual probability of passing of the parameter in position m is higher than an individual probability of passing of the parameter in position m−1.

Example 24 is the method of example(s) 23, wherein determining an individual probability of passing for a parameter includes modeling a univariate normal distribution of the parameter.

Example 25 is the method of example(s) 21, wherein the receiving a set of test values for the parameters includes scaling up standard deviation of test values of the set of test values by a scaling factor.

Example 26 is the method of example(s) 25, wherein the scaling factor is determined based on count of the test values for the parameter outside of the one or more limits for the parameter.

Example 27 is the method of example(s) 25, wherein the scaling factor is determined based on the incremental cumulative probability of passing for the parameter.

Example 28 is the method of example(s) 25, wherein the scaling up standard deviation is performed if the incremental cumulative probability of passing for the parameter is below a threshold for certainty.

Example 29 is the method of example(s) 25, wherein the scaling up standard deviation is stopped if the incremental cumulative probability of passing for the parameter is not significantly different from an incremental cumulative probability of passing for the parameter with a lower scaling factor.

Example 30 is the method of example(s) 21, wherein the receiving the test data includes normalizing the test values.

Example 31 is the method of example(s) 30, wherein normalizing the test values comprises modifying the test values to convert the one or more limits to −1 for the lower limit and +1 for the upper limit.

Example 32 is the method of example(s) 21, wherein obtaining a set of simulated vectors includes randomly sampling a multivariate distribution.

Example 33 is the method of example(s) 32, wherein the multivariate distribution is a multivariate normal distribution.

Example 34 is the method of example(s) 33, wherein randomly sampling the multivariate normal distribution includes determining a mean vector and a covariance matrix based on the set of test values.

Example 35 is the method of example(s) 34, wherein the determining the covariance matrix includes scaling up covariance values in the covariance matrix.

Example 36 is the method of example(s) 32, wherein the randomly sampling a multivariate distribution includes applying Monte Carlo technique (generating draws from a probability distribution) on the distribution.

Example 37 is the method of example(s) 21, wherein the pass value is 1 or TRUE.

Example 38 is the method of example(s) 21, wherein the determining a cumulative probability of passing for a parameter includes summing the pass values of the parameter.

Example 39 is the method of example(s) 38, further including normalizing the cumulative probability of passing to the size of the passing vector.

Example 40 is the method of example(s) 21, wherein a count of devices in the plurality of devices is less than 1000.

Example 41 is the method of example(s) 21, wherein the threshold is determined based on the size of the passing vector.

Example 42 is the method of example(s) 21, wherein the device is not in the plurality of devices.

Example 43 is the method of example(s) 42, wherein the device is similar to devices from the plurality of devices.

Example 44 is a method of reducing a set of parameters for testing a device, the method comprising: receiving test data for parameters from the set of parameters by: receiving a set of test values for the parameters obtained from testing a plurality of devices; and receiving a set of one or more limits for the parameters; determining a reduced set of parameters by: determining a set of simulated vectors containing simulated values for the parameters based on the set of test values; determining incremental cumulative probabilities of passing for the parameters based on the simulated values; determining a reduced set of parameters by removing parameters with the incremental cumulative probability of passing lower than a threshold from the set of parameters into a redundant set of parameters; and determining a combined reduced set of parameters based on appending the reduced set of parameters to the combined reduced set of parameters from the computer memory; if the size of the combined reduced set of parameters and the size of the combined reduced set of parameters from the computer memory are not equal: storing the combined reduced set of parameters in the computer memory; determining a set of parameters based on appending the redundant set of parameters to the reduced set of parameters; and repeating the step of determining the reduced set of parameters; and deploying the combined reduced set of parameters from the computer memory for testing the device.

Example 45 is the method of example(s) 44, wherein the receiving the test data includes normalizing the test values.

Example 46 is the method of example(s) 45, wherein normalizing the test values comprises modifying the test values to convert the one or more limits to −1 for the lower limit and +1 for the upper limit.

Example 47 is the method of example(s) 44, wherein the receiving a set of test values for the parameters includes scaling up standard deviation of test values of the set of test values by a scaling factor.

Example 48 is the method of example(s) 47, wherein the scaling factor is determined based on count of the test values for the parameters outside of the respective one or more limits.

Example 49 is the method of example(s) 48, wherein the scaling up standard deviation is performed when the size of the redundant set is below a size threshold.

Example 50 is the method of example(s) 47, wherein the scaling up standard deviation is stopped when the size of the reduced set is not significantly higher from a size of the reduced set with a lower scaling factor.

Example 51 is the method of example(s) 44, wherein a count of devices in the plurality of devices is less than 1,000.

Example 52 is the method of example(s) 44, wherein the determining a reduced set of parameters includes arranging the parameters in the reduced set of parameters descending based on the incremental cumulative probabilities of passing.

Example 53 is the method of example(s) 44, wherein the determining a reduced set of parameters includes arranging the parameters in the redundant set of parameters ascending based on individual probabilities of passing.

Example 54 is the method of example(s) 53, wherein determining the individual probability of passing for a parameter includes modeling a univariate normal distribution of the parameter.

Example 55 is the method of example(s) 44, wherein the threshold is determined based on the size of the passing vector.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and various ways in which it may be practiced.

FIGS. 5A-5S illustrate various tables showing a simplified example of the method in FIG. 4.

FIG. 6 illustrates a table showing experimental results.

Figure 1:
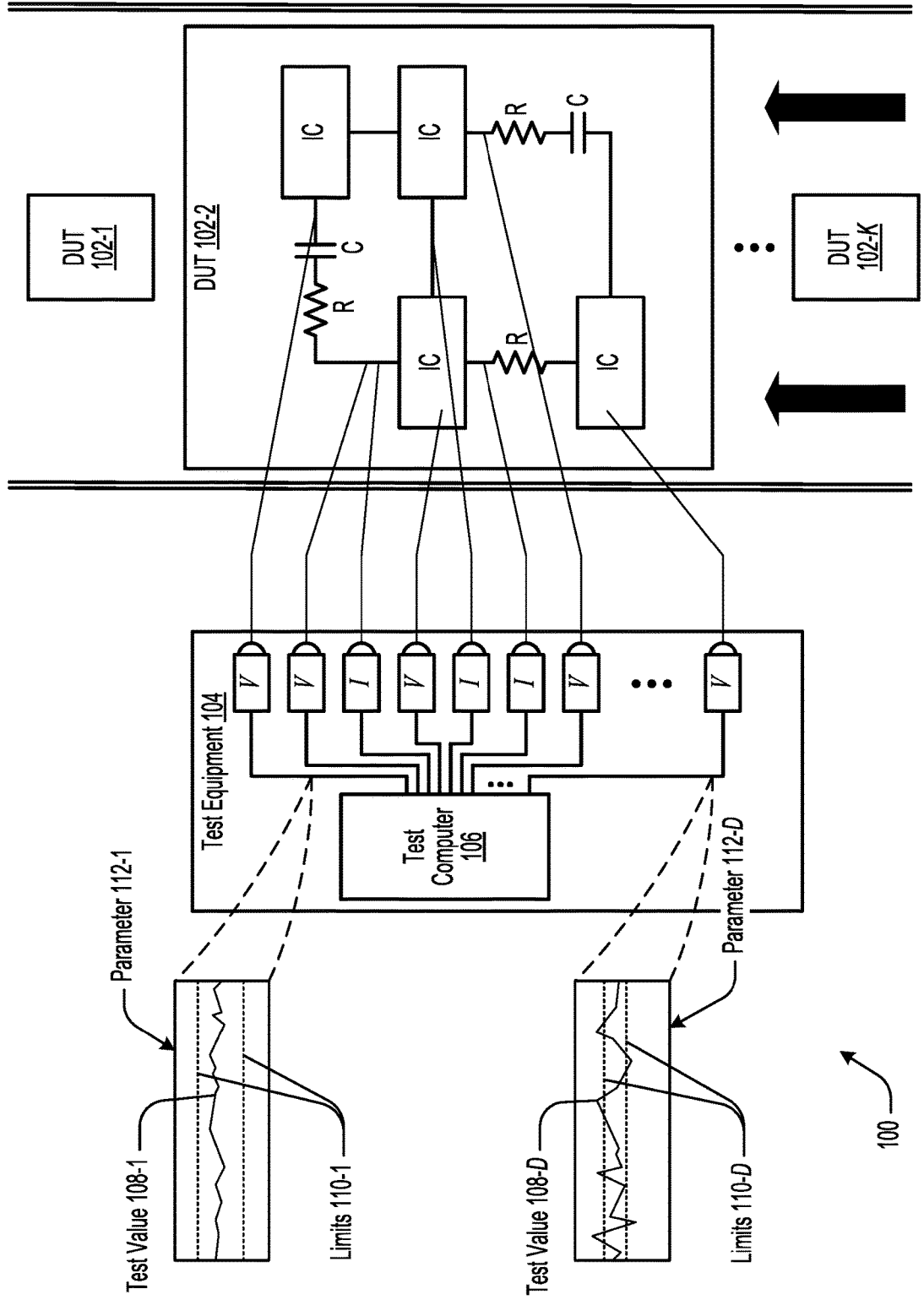
FIG. 1 illustrates a test environment in which a test equipment is used to test a number of DUTs.

In the appended figures, similar components and/or features may have the same numerical reference label. Further, various components of the same type may be distinguished by following the reference label with a letter or by following the reference label with a dash followed by a second numerical reference label that distinguishes among the similar components and/or features. If only the first numerical reference label is used in the specification, the description is applicable to any one of the similar components and/or features having the same first numerical reference label, irrespective of the suffix.

DETAILED DESCRIPTION OF THE INVENTION

A manufactured product, such as an electrical device, can be tested in accordance with a particular test. Performing the test can include making physical measurements on the device in accordance with a set of parameters. Each parameter in the set of parameters may be associated with a lower limit and/or an upper limit. A test value for a parameter that is either below the lower limit for the parameter or above the upper limit for the parameter causes the test to fail for that parameter, and additionally causes the device to fail for the entire test. Whereas a test value that is between the lower limit and the upper limit causes the test to pass for that particular parameter. As such, a test is considered to pass if and only if the test is passed for each and every parameter, and the test is considered to fail if the test fails for at least one parameter.

In some embodiments, a parameter can be considered as a permutation of different variables being swept over, e.g. frequency, gain state, voltage, current, etc. In one example, a particular parameter may be a voltage reading or measurement at a specific location in the device-under-test (DUT). Continuing with this example, another parameter may be a current reading or measurement at the same location in the DUT. Continuing again with this example, yet another parameter may be a frequency reading of an output voltage at a different location in the DUT. In various examples, each test value may be a voltage, a current, a frequency, a gain, a resistance, a capacitance, an inductance, among other possibilities.

Determining which parameters to include and exclude from a test can have important implications on the effectiveness of the test. Some conventional approaches utilize a manual determination of which parameters to run. These approaches are complex and difficult, and involve an analysis that requires significant time and skills. Other conventional approaches utilize machine-learning models, however such approaches are complex, susceptible to overfitting, and the decision logic may be hard to discern and debug. Furthermore, the training of machine-learning models requires large training sets, often of over 1,000,000 points.

Embodiments of the present disclosure provide methods for identifying redundant parameters for reducing the number of parameters in a device test. Embodiments provide a significant improvement in test execution and development time by identifying redundant parameters while minimizing test escapes (undetected failures). Embodiments are effective with a small training set (often less than 1,000 values), are unlikely to overfit, and are easy to understand and debug. Among other contributions, embodiments of the present disclosure provide an effective approach to (1) determining if an individual parameter is redundant based on an incremental cumulative probability of passing, and (2) determining a reduced set of parameters based on an iterative analysis of redundant and reduced sets of parameters.

In some embodiments of the present disclosure, measurements on multiple devices can be obtained during a training phase. These devices may be referred to as "training devices", as test data obtained with these measurements are used to train the mathematical algorithm for identifying redundant parameters. As used herein, the number of training devices may be equal to K, and the number of parameters in the initial set of parameters may be equal to D. During training, multiple test values (measurements or readings) are obtained for each parameter in the set of parameters, and for each device in the plurality of training devices, such that the number of test values obtained is equal to D×K.

The D×K test values may be provided to a test computer, which may be an element of the test equipment. The disclosed technique uses these test values to reorder the initial set of parameters to be in priority order of most important to least important. Then, the technique attempts to specify a cut-off, M, so that this reordered set of parameters is truncated to size M by removing the last D−M entries. The test computer takes these first M parameters from the reordered set to form a reduced set of parameters. The test computer may then deploy the reduced set of parameters to test any number of devices in an efficient manner while maintaining the accuracy of an alternative test that uses all D of the original parameters.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

FIG. 1 illustrates a test environment 100 in which a test equipment 104 is used to test a number of DUTs 102, in accordance with some embodiments of the present disclosure. DUTs 102 may be manufactured products, such as electrical devices, mechanical devices, among other possibilities. Test equipment 104 may be used to determine whether each of DUTs 102 passes a test that is associated with a set of parameters 112. In the illustrated example, each of DUTs includes an electrical circuit with various electrical components, and the set of parameters 112 correspond to a number of electrical measurements (e.g., voltage and current measurements) at various locations in the electrical circuit. In the illustrated example, the number of DUTs 102 is equal to K and the number of parameters 112 is equal to D.

Each of parameters 112 may be associated with one or more limits 110 that delineate the boundary between test values that are considered to pass for the particular parameter and test values that are considered to fail for the particular parameter. Limits 110 may include a single or multiple limits for each parameter. In the illustrated example, a parameter 112-1 is associated with a set of limits 110-1 that include a lower limit and an upper limit, and a parameter 112-D is associated with a set of limits 110-D that also include a lower limit and an upper limit.

Test equipment 104 may be equipped with a number of instruments to make measurements on DUTs so as to obtain a set of test values 108 from DUTs 102. Test values 108 may be provided to a test computer 106 of test equipment 104 that includes a number of hardware elements such as processors and memory units for performing data computations. Test computer 106 may compare each of test values 108 to limits 110 for each of parameters 112 to determine whether a device from DUTs 102 passes or fails the test. In the illustrated example, while test value 108-1 is between limits 110-1 and passes the test for parameter 112-1, test value 108-D lies above the upper limit of limits 110-D, therefore causing DUT 102-2 to fail the test as a whole. Continuing with this process, test equipment 104 can determine a pass/fail status for each of DUTs 102 using parameters 112.

Figure 2:
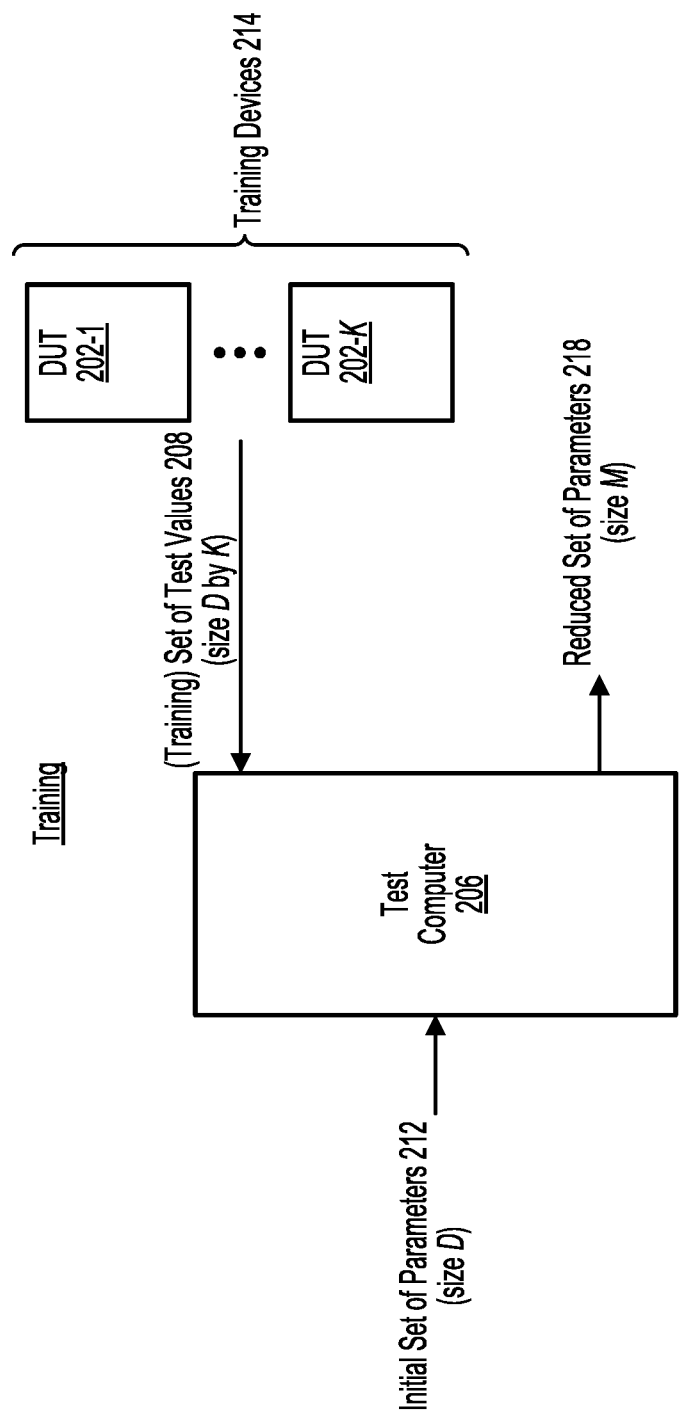
FIG. 2 illustrates a training phase in which a test computer determines a reduced set of parameters from an initial set of parameters.

FIG. 2 illustrates a training phase in which a test computer 206 determines a reduced set of M parameters 218 from an initial set of D parameters 212, in accordance with some embodiments of the present disclosure. In the illustrated example, a set of D×K test values 208 for parameters 212 are obtained from a plurality of training devices 214, which include K DUTs 202. Test computer 206 may perform various operations as described herein to reduce the number of parameters in parameters 212 (e.g., M<D) while substantially maintaining the accuracy of the associated test.

Figure 3:
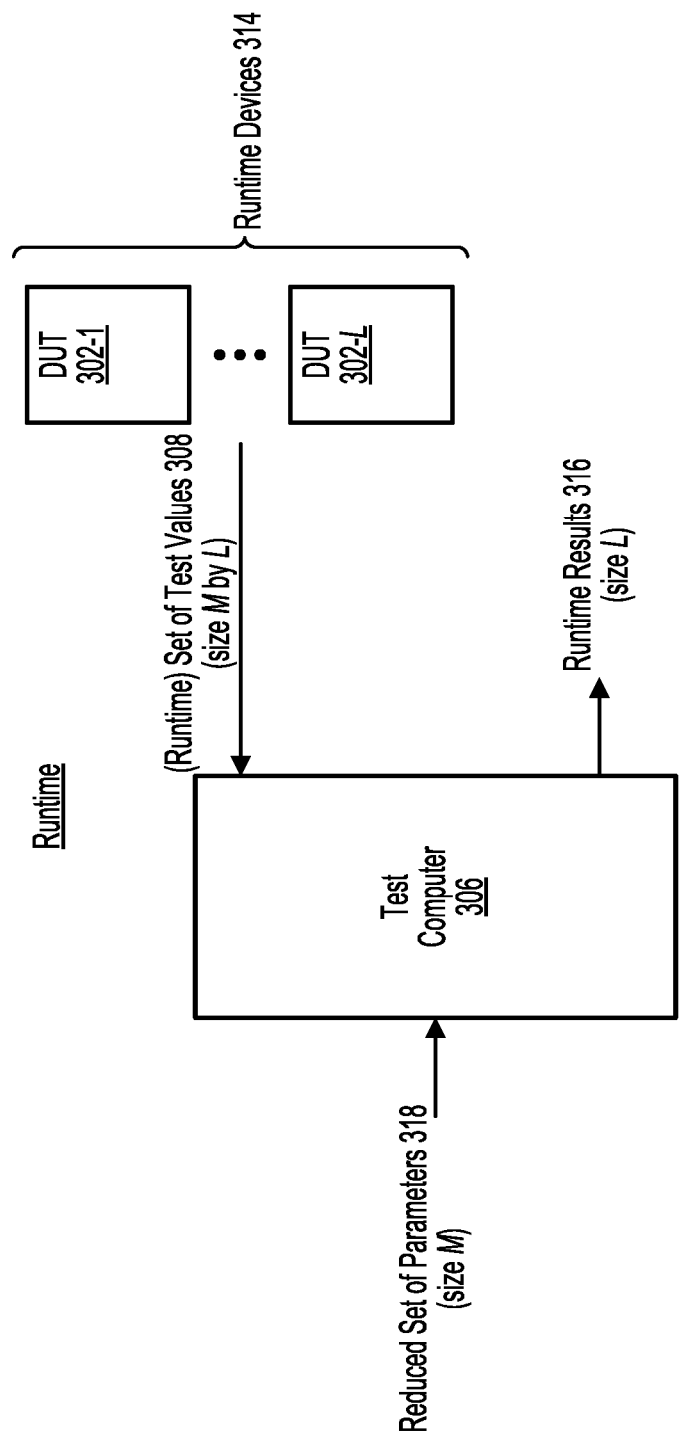
FIG. 3 illustrates a runtime phase in which a test computer determines runtime results using a reduced set of parameters.

FIG. 3 illustrates a runtime phase in which a test computer 306 determines L runtime results 316 using a reduced set of M parameters 318, in accordance with some embodiments of the present disclosure. The runtime phase shown in FIG. 3 may be carried out subsequent to the training phase shown in FIG. 2. In the illustrated example, a set of M×L test values 308 for parameters 318 are obtained from a plurality of runtime devices 314, which include L DUTs 302. Test computer 306 may perform various operations as described herein to determine runtime results 316, which may include a pass/fail status for each of runtime devices 314 in accordance with a test.

Figure 4:
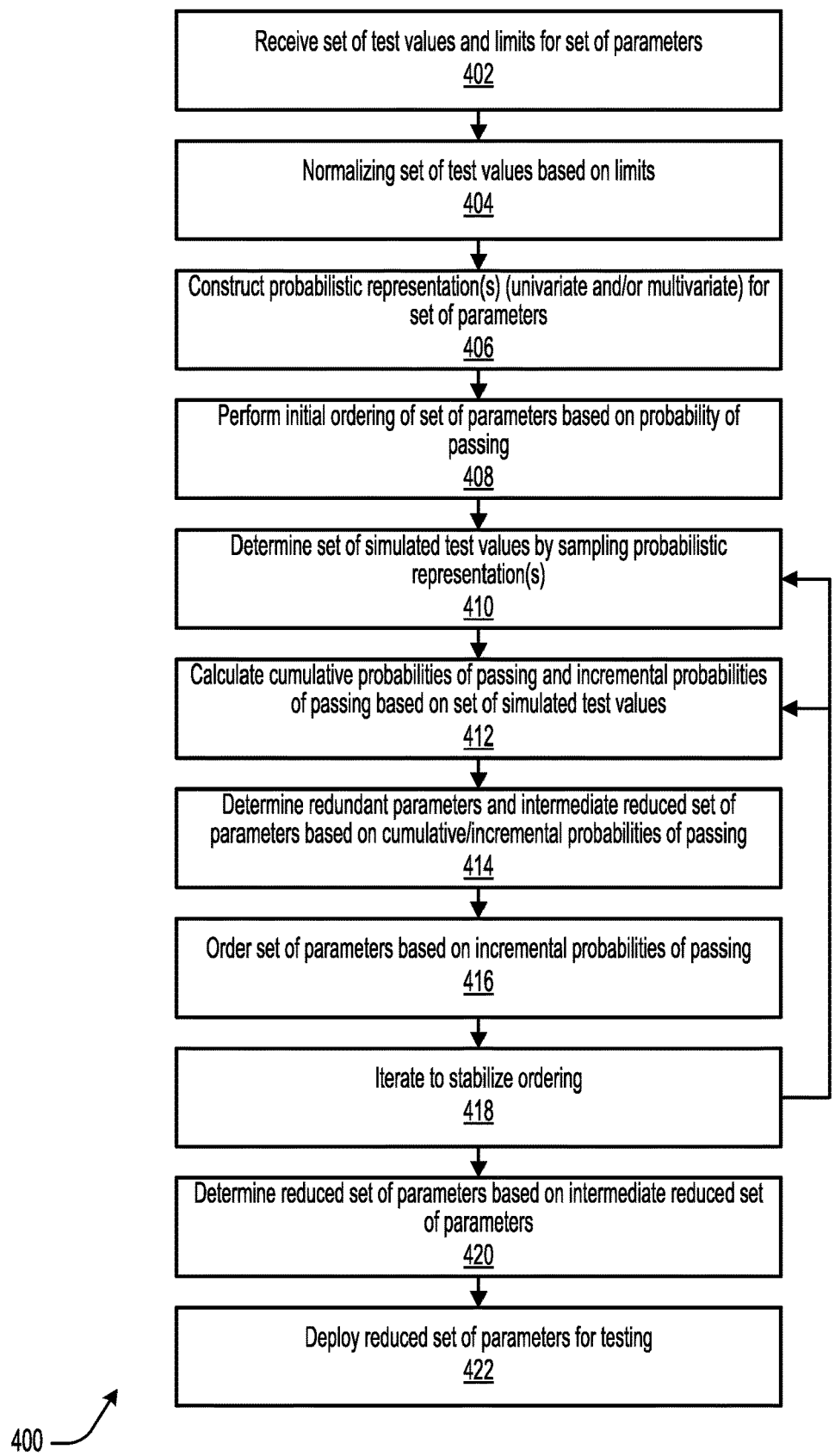
FIG. 4 illustrates a method of identifying redundant parameters for reducing the number of parameters in a device test.

FIG. 4 illustrates a method 400 of identifying redundant parameters for reducing the number of parameters in a device test, in accordance with some embodiments of the present disclosure. One or more steps of method 400 may be omitted during performance of method 400, and steps of method 400 may be performed in any order and/or in parallel. One or more steps of method 400 may be performed by one or more processors, such as those included in a test computer. Method 400 may be implemented as a computer-readable medium or computer program product comprising instructions which, when the program is executed by one or more computers, cause the one or more computers to carry out the steps of method 400.

At step 402, a set of test values (e.g., sets of test values 108, 208, 308) for a set of parameters (e.g., sets of parameters 112, 212) are received. The set of test values may be received from a plurality of training devices (e.g., training devices 214), which may include K DUTs (e.g., DUTs 102, 202, 302). The set of test values may be measured by a test equipment (e.g., test equipment 104) and may be received by a test computer (e.g., test computers 106, 206, 306). Further at step 402, limits (e.g., limits 110) for the set of parameters are received. The limits may include a lower limit and an upper limit for each of the set of parameters. The limits may be received by the test computer.

At step 404, the set of test values are normalized based on the limits. The set of test values may be normalized by converting the lower limit to −1 and the upper limit equal to 1 for each of the set of parameters. In some embodiments, normalization may be performed using the following equation:

$$\text{data}_{norm} = \frac{\text{data}_{orig} - \frac{upperlimit + lowerlimit}{2}}{\frac{upperlimit - lowerlimit}{2}}$$

In some embodiments, the test values for some parameters may already be normalized to the limits prior to receiving the values, and thus may not be affected by the normalization in step 404. In such embodiments, receiving the set of limits may include receiving the lower limit as −1 and the upper limit as +1.

In some embodiments, each parameter from the set of parameters is treated as its own random variable. The probability of passing the test may be denoted as $\mathcal{P}_{Success}$, which may be defined as the probability that all parameters (all random variables) in set of parameters are in the interval of (−1, +1). The probability of failing the test may be denoted as $\mathcal{P}_{Failure}$, which may be defined as $\mathcal{P}_{Failure} = 1 - \mathcal{P}_{Success}$. With respect to the random variables, the probability of failing is equal to the probability that one or more parameters (random variables) have a value outside the interval (−1, +1).

In some embodiments, the set of parameters may alternatively be referred to as the full set of parameters, which may correspond to all the original parameters in the set of parameters. The full set of parameters may be denoted as $\mathbb{S}_{Full} \in \mathbb{N}^D$ where $\mathbb{N}$ is an abbreviation for $\mathbb{N}_0$ (non-negative integers), and where D is the number of parameters in the full set of parameters, and where $\mathbb{S}_{Full} = \{0, 1, 2, \ldots, D-1\}$ (with a zero-based index with respect to the original ordering of the parameters).

In some embodiments, the reduced set of parameters may correspond to a strict subset of full set of parameters and may be denoted as $\mathbb{S}_{Reduced} \in \mathbb{N}^M$ where M is the number of parameters in the reduced set of parameters. As such, $\mathbb{S}_{Reduced} \subset \mathbb{S}_{Full}$ and therefore M<D. The probability of failing using the full set of parameters is always greater than or equal to the probability of failing using the reduced set of parameters, i.e. $\mathcal{P}_{Failure}(\mathbb{S}_{Reduced}) \leq \mathcal{P}_{Failure}(\mathbb{S}_{Full})$. Because $\mathbb{S}_{Reduced} \subset \mathbb{S}_{Full}$, $\mathbb{S}_{Full}$ has more chances to fail.

In some embodiments, an objective may be to make $\mathcal{P}_{Failure}(\mathbb{S}_{Reduced})$ as close to $\mathcal{P}_{Failure}(\mathbb{S}_{Full})$ as possible. Alternatively expressed, the objective may be to make ε in the following equation as small as possible:

$$\mathcal{P}_{Failure}(\mathbb{S}_{Reduced}) + \varepsilon = \mathcal{P}_{Failure}(\mathbb{S}_{Full})$$

where ε≥0. Another objective, along with minimizing ε, is to also minimize the size of the reduced set of parameters M.

At step 406, one or more probabilistic representations are constructed for the set of parameters based on the set of test values. The one or more probabilistic representations may include one or more univariate normal distributions and/or one or more multivariate normal distributions. In a particular embodiment, step 406 includes constructing a set of M univariate normal distributions for the set of parameters (i.e., one univariate normal distribution for each parameter) and a single multivariate normal distribution for all of the set of parameters.

Each of the set of parameters may be modeled using a univariate normal distribution by calculating a mean μ and a standard deviation σ for the corresponding test values, and then deriving the equation for the univariate normal distribution as follows:

$$\mathcal{N}(x \mid \mu, \sigma^2) = \frac{1}{\sigma\sqrt{2\pi}} e^{-\frac{1}{2}\left(\frac{x-\mu}{\sigma}\right)^2}, x \in \mathbb{R}, \mu \in \mathbb{R}, \sigma \in \mathbb{R}$$

In some embodiments, using the univariate normal for each of the set of parameters, the probability of success can be expressed as follows:

$$\mathcal{P}_{Success} = \int_{-1}^{+1} \mathcal{N}(x \mid \mu, \sigma^2) dx = \int_{-1}^{+1} \frac{1}{\sigma\sqrt{2\pi}} e^{-\frac{1}{2}\left(\frac{x-\mu}{\sigma}\right)^2} dx$$

The closed form solution can be found as follows:

$$CDF_{\mathcal{N}(x \mid \mu, \sigma^2)} = \int_{-\infty}^{x} \mathcal{N}(x \mid \mu, \sigma^2) dx = \frac{1}{2}\left[1 + \text{erf}\left(\frac{x-\mu}{\sigma\sqrt{2}}\right)\right]$$

$$\mathcal{P}_{Success} = CDF_{\mathcal{N}(x=1 \mid \mu, \sigma^2)} - CDF_{\mathcal{N}(x=-1 \mid \mu, \sigma^2)} = \frac{1}{2}\left[\text{erf}\left(\frac{1-\mu}{\sigma\sqrt{2}}\right) - \text{erf}\left(\frac{-1-\mu}{\sigma\sqrt{2}}\right)\right]$$

In some embodiments, a multivariate normal distribution, also known as a multivariate Gaussian, may be constructed using the set of test values for the set of parameters. The probability density function (PDF) of the multivariate normal may be expressed as:

$$\mathcal{N}(x \mid \mu, \Sigma) = (2\pi)^{-\frac{D}{2}} \det(\Sigma)^{-1} e^{-\frac{1}{2}(x-\mu)^T \Sigma^{-1}(x-\mu)}$$

where: $x \in \mathbb{R}^D$, $\mu \in \mathbb{R}^D$, $\Sigma \in \mathbb{R}^{D \times D}$. Using the PDF of the multivariate normal, the probability of passing can be estimated as:

$$\mathcal{P}_{Success} = \int_{-\vec{1}}^{+\vec{1}} \mathcal{N}(x \mid \mu, \Sigma) dx = \int_{-\vec{1}}^{+\vec{1}} (2\pi)^{-\frac{D}{2}} \det(\Sigma)^{-1} e^{-\frac{1}{2}(x-\mu)^T \Sigma^{-1}(x-\mu)} dx$$

where: $+\vec{1} = [1\ 1\ 1\ \ldots\ 1]^T \in \mathbb{R}^D$ and $+\vec{1} = [1\ 1\ 1\ \ldots\ 1]^T \in \mathbb{R}^D$ $\vec{1} = [-1\ -1\ -1\ \ldots\ -1]^T \in \mathbb{R}^D$. Since this is mathematically intractable for D>1, $\mathcal{P}_{Success}$ is to be estimated, as described below.

At step 408, an initial ordering of the set of parameters is performed based on the probability of passing for each of the set of parameters. In some embodiments, the probability of passing for each of the set of parameters may be determined using the one or more probabilistic representations. In a particular embodiment, the probability of passing for each of the set of parameters can be calculated using the univariate normal distributions, as described above. In some embodiments, the ordering may be the probability of passing in ascending order (lowest probability of passing first and the highest probability of passing last). This is the same as ordering by the probability of failing in descending order (highest probability of failing first and lowest probability of failing last). When using the univariate normal distributions, this initial ordering can be referred to as the full set of parameters ordering $\mathbb{S}_{OrderedByUnivariate}$.

At step 410, a set of simulated test values are determined based on the one or more probabilistic representations. In some embodiments, the one or more probabilistic representations may be sampled to determine the set of simulated test values, which may form simulated vectors for the set of parameters. In some embodiments, the set of simulated test values are determined by sampling the multivariate normal distribution. The set of simulated test values (and corresponding simulated vectors) may be converted into a set of passing values (and corresponding passing vectors), each being a value of 0 or 1. Each of the set of simulated test values may be converted into a corresponding one of the set of passing values by converting the simulated test value to 0 if it is below −1 or above 1 and converting the simulated test value to 1 if it is between −1 and 1 (unless any preceding simulated test value in the same simulated vector has been converted to 0, in which case the simulated test value is also converted to 0).

At step 412, a set of cumulative probabilities of passing for the set of parameters are calculated based on the set of simulated test values. In some embodiments, a probability of passing based on the multivariate normal can be estimated by using a Monte Carlo approach, in which N random samples are taken from the multivariate normal distribution $\mathcal{N}(x \mid \mu, \Sigma)$, where $x \in \mathbb{R}^D$. For each sample, if all D variables are in the interval defined by the lower and upper limits (or, if normalized, the interval (−1, +1)), a sum S is incremented by 1. Hence, S is the number of all samples that "pass", and $\mathcal{P}_{Success}$ is given by:

$$\mathcal{P}_{Success} \approx \frac{S}{N}$$

In some embodiments, N is set equal to N=1,000,000.

In some embodiments, a cumulative probability of passing can be calculated using a modification of a simple probability of passing, which generally includes returning a single scalar value. In contrast, the cumulative probability of passing returns a vector result:

$$y = [y_1 y_2 y_3 \ldots y_D]^T, y \in \mathbb{R}^D$$

where $y_i$ is the probability of passing looking at the first i variables in the set of D variables. For example, given an ordered set of parameters $\mathbb{S} = (a\ b\ c\ d\ e\ f)$, the vector result is:

$$y = [\mathcal{P}_{Success}(\{a\}) \mathcal{P}_{Success}(\{a\ b\}) \mathcal{P}_{Success}(\{a\ b\ c\}) \ldots \mathcal{P}_{Success}(\{a\ b\ c\ d\ e\ f\})]^T$$

The values of y are sensitive to the ordering of the set of parameters, except for the last value, $y_D$, which is the same as the result for the simple probability of passing.

In some embodiments, a technique for estimating the cumulative probability of passing includes modifying a simple Monte Carlo using the cumprod function. Consider that a random sample x is defined as follows:

$$x = [x_1 x_2 x_3 \ldots x_D]^T$$

where $x \in \mathbb{R}^D$. Functions $f(x)$, $g(x)$, and $h(x)$ may also be defined as follows:

$$f(x) = \begin{cases} 1 & \text{if } x \text{ in interval}(-1, +1) \\ 0 & \text{otherwise} \end{cases}, f(x) \in \mathbb{N}$$

$$g(x) = [f(x_1)\ f(x_2)\ f(x_3)\ \ldots\ f(x_D)]^T, g(x) \in \mathbb{N}^D$$

$$h(x) = cumprod(g(x)), h(x) \in \mathbb{N}^D$$

Next, N random samples may be taken from the distribution $\mathcal{N}(x \mid \mu, \Sigma)$, where $x \in \mathbb{R}^D$. Next, each sample is converted by $x \rightarrow h(x)$. This will result in a matrix $X \in \mathbb{N}^{N \times D}$. The rows of X are then summed to create a vector $m \in \mathbb{N}^D$. The resulting estimation of cumulative probability of passing would be:

$$y = \frac{1}{N} m, y \in \mathbb{R}^D, m \in \mathbb{N}^D, N \in \mathbb{N}$$

In some embodiments, a "cumulative" Monte Carlo is performed on the ordered set of the full set of parameters, $\mathbb{S}_{OrderedByUnivariate}$, ordered by independent probability of passing (in ascending order). The input ordered set $\mathbb{S}_{OrderedByUnivariate}$ may be expressed as:

$$\mathbb{S}_{OrderedByUnivariate} = (p_1, p_2, \ldots, p_D), p_i \in \mathbb{N}$$

where $\mathcal{P}_{Success}(\{p_1\}) \leq \mathcal{P}_{Success}(\{p_2\}) \leq \ldots \leq \mathcal{P}_{Success}(\{p_D\})$ with $\mathcal{P}_{Success}$ defined by the univariate normal. The output y may be expressed as $$y = [\mathcal{P}_{Success}(\{p_1\}) \mathcal{P}_{Success}(\{p_1, p_2\}) \ldots \mathcal{P}_{Success}(\{p_1, p_2, \ldots, p_D\})]^T$$

with $\mathcal{P}_{Success}$ defined by multivariate normal. In this example, the output y is a vector corresponding to the set of cumulative probabilities of passing.

Further at step 412, a set of incremental probabilities of passing are calculated based on the set of cumulative probabilities of passing. In some embodiments, the set of incremental probabilities of passing (alternatively referred to as the set of cumulative incremental probabilities of passing) are calculated by examining the change in the probability of passing when adding the next point as follows:

$$\Delta\mathcal{P}_{Success}(p_i) = \mathcal{P}_{Success}(\{p_1, p_2, \ldots, p_{i-1}, p_i\}) - \mathcal{P}_{Success}(\{p_1, p_2, \ldots, p_{i-1}\}),$$

where $\Delta \mathcal{P}_{Success}(p_i) \leq 0$. Recalling the above equation for the vector y, a vector z may correspond to the set of incremental probabilities of passing may be expressed as $z=y[2:D]-y[1:D-1]$. Vector z may therefore be expressed as:

$$z=[\Delta \mathcal{P}_{Success}(p_2) \Delta \mathcal{P}_{Success}(p_3) \ldots \Delta \mathcal{P}_{Success}(p_D)]^T, z \in \mathbb{R}^{D-1}$$

It can be observed that $\Delta \mathcal{P}_{Success}(p_1)$ is not defined. As such, the first parameter in the ordered set of parameters may be included in the reduced set of parameters (during the first iteration).

At step 414, one or more redundant parameters are determined/identified from the set of parameters based on the set of incremental probabilities of passing. Further at step 414, an intermediate reduced set of parameters are identified from the set of parameters by removing the one or more redundant parameters from the set of parameters. In some embodiments, the one or more redundant parameters may be identified by determining which values of vector z have a magnitude below a predetermined threshold.

In some examples, the first point $p_1$ in the ordered set of parameters stays the first point in the intermediate reduced set of parameters, as this point had the lowest independent probability of passing. It can be determined whether each point (parameter) $p_i$, $i \in [2, D]$ is to be included in the one or more redundant parameters if $|\Delta \mathcal{P}_{Success}(p_i)| \leq \varepsilon$. Likewise, it can be determined whether each point (parameter) $p_i$, $i \in [2, D]$ is to be included in the intermediate reduced set of parameters if $|\Delta \mathcal{P}_{Success}(p_i)| \geq \varepsilon$. In some examples, E can be set to a value such as $\varepsilon = 1 \times 10^{-6}$.

At step 416, the intermediate reduced set of parameters are ordered based on the incremental probabilities of passing. The intermediate reduced set of parameters may be ordered in descending order with highest incremental probability of passing first and lowest incremental probability of passing last.

At step 418, it is determined whether to iterate back through steps 410 to 416 (or steps 412 to 414). In some embodiments, it is determined whether to iterate based on whether the intermediate set of parameters has stabilized between iterations. For example, if the parameters included in the intermediate set of parameters has not changed between iterations (regardless of the ordering of the included parameters), it may be determined to exit the loop and continue to step 420. Iterating back through method 400 ensures a stable list of parameters, as the "cumulative" Monte Carlo may be sensitive to a particular ordering.

In some embodiments, a new ordered full set of parameters ordering is created by starting with the determined intermediate reduced set of parameters and appending the points (parameters) that are not in the reduced set of parameters. These points may be added in $\mathbb{S}_{OrderedByUnivariate}$ order. For example, $$\mathbb{S}_{OrderedFull}^{(i)} \mathbb{S}_{CombinedOrderedReduced}^{(i-1)} + (\mathbb{S}_{OrderedByUnivariate} \setminus \mathbb{S}_{CombinedOrderedReduced}^{(i-1)})$$

A new intermediate reduced set of parameters $\mathbb{S}_{OrderedReduced}^{(i)}$ can be found based on ordering of $\mathbb{S}_{OrderedFull}^{(i)}$ (using "cumulative" Monte Carlo and the incremental cumulative probability of passing approach). $\mathbb{S}_{CombinedOrderedReduced}^{(i)}$ is the combination of all previously found reduced sets of parameters:

$$\mathbb{S}_{CombinedOrderedReduced}^{(i)} \leftarrow \mathbb{S}_{OrderedReduced}^{(1)} \cup \ldots \cup \mathbb{S}_{OrderedReduced}^{(i)}$$

The loop may be terminated when the combined reduced set of parameters is the same twice in a row, e.g., when $\mathbb{S}_{CombinedOrderedReduced}^{(i)} = \mathbb{S}_{CombinedOrderedReduced}^{(i+1)}$.

One or more of the steps of method 400 can be illustrated by pseudo code as the function reduce_by_change_of_probability($x_{mean} \in \mathbb{R}^D$, $X_{cov} \in \mathbb{R}^{D \times D}$, $\mathbb{S}_{OrderedFullSpace} \in \mathbb{N}^D$) → $\mathbb{N}^M$ as follows:

cum_probs ← cumulative_monte_carlo($x_{mean}, X_{cov}$, $\mathbb{S}_{OrderedFullSpace}$)[$\in \mathbb{R}^D$]

change_in_probs ← |cum_probs[2:D] − cum_probs[1:

D−1][$\in \mathbb{R}^{D-1}$]

ordered_change_in_probs_indices ← argmax (change_in_probs)[$\in \mathbb{N}^{D-1}$]

$\mathbb{S}_{OrderedReduced} \rightarrow \mathbb{S}_{OrderedFullSpace}^{(1)}$ for each $i$ in $(1, 2, \ldots, D-1)$ do:

$j \leftarrow$ ordered_change_in_probs_indices$^{(i)}[\in \mathbb{N}]$ if change_in_probs$^{(j)} < \varepsilon$ do:

break out of loop $\mathbb{S}_{OrderedReduced} \leftarrow \mathbb{S}_{OrderedReduced} +$ $\mathbb{S}_{OrderedFullSpace}^{(j+1)}$ return $\mathbb{S}_{OrderedReduced}$ One or more of the steps of method 400 can be illustrated by pseudo code as the function innerloop($x_{mean} \in \mathbb{R}^D$, $X_{cov} \in \mathbb{R}^{D \times D}$) → $\mathbb{N}^M$ as follows:

$\mathbb{S}_{OrderedByUnivariate} \leftarrow$ order_by_univariate($x_{mean}, X_{cov}$)

$\mathbb{S}_{CombinedOrderedReduced} \leftarrow \emptyset$ do:

$\mathbb{S}_{OrderedFullSpace} \leftarrow \mathbb{S}_{CombinedOrderedReduced} +$ $(\mathbb{S}_{OrderedByUnivariate} \setminus \mathbb{S}_{CombinedOrderedReduced})$ $\mathbb{S}_{OrderedReduced} \leftarrow$ reduce_by_change_of _probability $(x_{mean}, X_{cov}, \mathbb{S}_{OrderedFullSpace})$ $\mathbb{S}_{PreviousCombinedOrderedReduced} \leftarrow$ $\mathbb{S}_{CombinedOrderedReduced}$ $\mathbb{S}_{CombinedOrderedReduced} \leftarrow$ $\mathbb{S}_{PreviousCombinedOrderedReduced} \cup \mathbb{S}_{OrderedReduced}$ while $\mathbb{S}_{CombinedOrderedReduced} \neq$ $\mathbb{S}_{PreviousCombinedOrderedReduced}$ return $\mathbb{S}_{CombinedOrderedReduced}$ At step 420, a reduced set of parameters (e.g., reduced set of parameters 218) are determined. The reduced set of parameters may be determined using the intermediate reduced set of parameters determined during the last iteration upon stabilizing the parameters in the intermediate reduced set of parameters, as described above.

At step 422, the reduced set of parameters are deployed for testing the device. In some embodiments, the test equipment may be used to test a plurality of runtime devices (e.g., runtime devices 314), which may include L DUTS. During the testing, the test equipment may measure a set of test values (e.g., sets of test values 108, 208, 308) for the reduced set of parameters, and the test computer may receive the set of test values to generate a set of runtime results (e.g., runtime results 316). Each of the set of L runtime results may indicate whether a corresponding one of the runtime devices has passed or failed the test.

In some embodiments, method 400 may include additional steps for sigma scaling to further improve performance in certain situations. For example, the Monte Carlo approach may be less effective when the probability of failing is very low, as it takes a lot of samples to properly quantify the probability of failing. Using sigma scaling, the data can be modified by multiplying its standard deviation, while keeping the mean the same. For example, letting the original data be represented by $X_{Orig} \in \mathbb{R}^{N \times D}$, where N is the number of observations (devices) and D is the size of the full set of parameters, the sigma scaled data $X_{scaled}$ can be calculated as follows:

$$X_{Scaled} = ((X_{orig} - \text{mean}(X_{orig})) \times s) + \text{mean}(X_{orig})$$

where $\text{mean}(\mathbb{R}^{N \times D}) \to \mathbb{R}^N$ takes the column-wise mean of the input matrix and s is the sigma scaling multiplier. In some embodiments, instead of trying to find the optimal sigma scaling factor s, one or more steps of method 400 can be performed on multiple values of s, and the reduced sets of parameters found from each scaling factor can be combined into a final reduced set of parameters.

Implementing sigma scaling into method 400 can be illustrated by pseudo code as the function outerloop($X_{orig} \in \mathbb{R}^{N \times D}) \to \mathbb{N}^M$ as follows:

$\mathbb{S}_{FinalReduced} \leftarrow \emptyset$ $X_{norm} \leftarrow \dfrac{X_{orig} - \dfrac{upperlimits(X_{orig}) + lowerlimits(X_{orig})}{2}}{\dfrac{upperlimits(X_{orig}) - lowerlimits(X_{orig})}{2}} [\in \mathbb{R}^{N \times D}]$ for each s in (1, 2, 3) do:

$X_{scaled} \leftarrow ((X_{norm} - \text{mean}(X_{norm})) \times s) + \text{mean}(X_{norm}) [\in \mathbb{R}^{N \times D}]$ $x_{mean} \leftarrow \text{mean}(X_{scaled}) [\in \mathbb{R}^D]$ $X_{cov} \leftarrow \text{cov}(X_{scaled}) [\in \mathbb{R}^{D \times D}]$ $\mathbb{S}_{ScaledReduced} \leftarrow \text{innerloop}(x_{mean}, X_{cov})$ $\mathbb{S}_{FinalReduced} \leftarrow \mathbb{S}_{FinalReduced} \emptyset \mathbb{S}_{ScaledReduced}$ return $\mathbb{S}_{FinalReduced}$ FIGS. 5A-5S illustrate various tables demonstrating a simplified example of how the steps of method 400 can be performed, in accordance with some embodiments of the present disclosure. FIG. 5A shows a set of parameters 512, where D=5, with an initial ordering of Param_1, Param_2, Param_3, Param_4, and Param_5. FIG. 5B shows a set of test values for the set of parameters, where K=10. FIG. 5C shows upper limits for the set of parameters. FIG. 5D shows lower limits for the set of parameters.

FIG. 5E shows a set of normalized test values for the set of parameters, which are calculated by normalizing the set of values in FIG. 5B based on the corresponding limits in FIGS. 5C and 5D. FIG. 5F shows means for the set of parameters, which are calculated based on the set of normalized test values in FIG. 5E. FIG. 5G shows variances for the set of parameters, which are calculated based on the set of normalized test values in FIG. 5E. FIG. 5H shows the univariate probabilities of passing for the set of parameters, which are calculated based on the means in FIG. 5F and the variances in FIG. 5G. FIG. 5I shows an initial ordering of the set of parameters based on the univariate probabilities of passing in FIG. 5H.

FIG. 5J shows covariances between the set of parameters, which are calculated based on the set of normalized test values in FIG. 5E. FIG. 5K shows a set of simulated test values for the ordered set of parameters, where N=25, forming a set of simulated vectors. The set of simulated test values are sampled from a multivariate Gaussian distribution that is constructed from the means in FIG. 5F and the covariances in FIG. 5J. FIG. 5L shows a set of passing values for the set of parameters, forming a set of passing vectors. The set of passing values are calculated by comparing the set of simulated test values in FIG. 5K to the normalized limits of −1 and 1, and by assigning 1 in positions where the simulated test value is between −1 and 1 and all preceding simulated test values in the same simulated vector are also between −1 and 1, and assigning 0 in positions where the simulated test value is above 1 or below −1 or any preceding simulated test value in the same simulated vector is above 1 or below −1.

FIG. 5M shows a set of cumulative probabilities of passing for the set of parameters, which are calculated based on the set of passing values in FIG. 5L. FIG. 5N shows a set of incremental probabilities of passing for the set of parameters, which are calculated based on the set of cumulative probabilities of passing in FIG. 5M. FIG. 5O shows redundant parameters being Param_1, Param_4, and Param_3, which are identified based on comparing the set of incremental probabilities of passing in FIG. 5N to a threshold of $1 \times 10^{-6}$. FIG. 5P shows an intermediate reduced set of parameters, which are determined by removing the redundant parameters in FIG. 5O from the set of parameters.

FIG. 5Q shows the intermediate reduced set of parameters ordered based on the univariate probabilities of passing in FIG. 5H. FIG. 5R shows the redundant parameters in FIG. 5O appended to the end of the intermediate reduced set of parameters in FIG. 5Q. FIG. 5S shows a reduced set of parameters, which may be determined by, starting from FIG. 5R, recalculating cumulative probabilities of passing (not shown), recalculating incremental probabilities of passing (not shown), identifying Param_1, Param_4, and Param_3 as being redundant parameters during the second iteration (not shown), and determining that the intermediate reduced set of parameters from the second iteration is identical to the intermediate reduced set of parameters from the first iteration.

FIG. 6 illustrates a table showing experimental results, in accordance with some embodiments of the present disclosure. The experimental results include a training size (K), a test size (L), a full space (D), a reduced space (M), and a space improvement for a number of tests. The reduction in the number of parameters was at least 60% for all tests, and exceeded 90% for four of the tests, demonstrating the effectiveness of the described techniques for a variety of tests.

Figure 7:
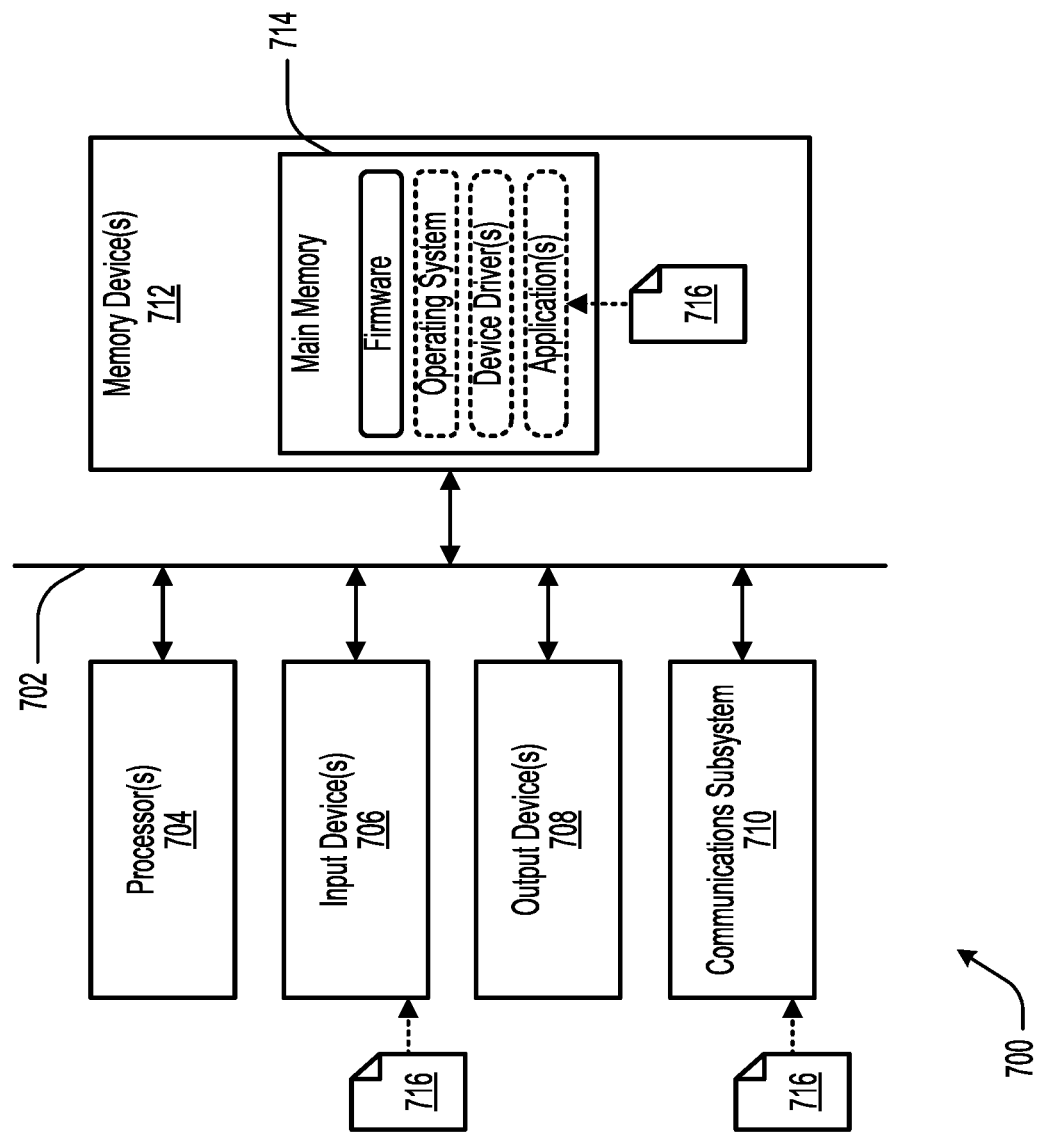
FIG. 7 illustrates an example computer system comprising various hardware elements.

FIG. 7 illustrates an example computer system 700 comprising various hardware elements, in accordance with some embodiments of the present disclosure. Computer system 700 may be incorporated into or integrated with devices described herein and/or may be configured to perform some or all of the steps of the methods provided by various embodiments. For example, in various embodiments, computer system 700 may be incorporated into test computers 106, 206, 306 and/or may be configured to perform method 400. It should be noted that FIG. 7 is meant only to provide a generalized illustration of various components, any or all of which may be utilized as appropriate. FIG. 7, therefore, broadly illustrates how individual system elements may be implemented in a relatively separated or relatively more integrated manner.

In the illustrated example, computer system 700 includes a communication medium 702, one or more processor(s) 704, one or more input device(s) 706, one or more output device(s) 708, a communications subsystem 710, and one or more memory device(s) 712. Computer system 700 may be implemented using various hardware implementations and embedded system technologies. For example, one or more elements of computer system 700 may be implemented as a field-programmable gate array (FPGA), such as those commercially available by XILINX®, INTEL®, or LATTICE SEMICONDUCTOR®, a system-on-a-chip (SoC), an application-specific integrated circuit (ASIC), an application-specific standard product (ASSP), a microcontroller, and/or a hybrid device, such as an SoC FPGA, among other possibilities.

The various hardware elements of computer system 700 may be communicatively coupled via communication medium 702. While communication medium 702 is illustrated as a single connection for purposes of clarity, it should be understood that communication medium 702 may include various numbers and types of communication media for transferring data between hardware elements. For example, communication medium 702 may include one or more wires (e.g., conductive traces, paths, or leads on a printed circuit board (PCB) or integrated circuit (IC), microstrips, striplines, coaxial cables), one or more optical waveguides (e.g., optical fibers, strip waveguides), and/or one or more wireless connections or links (e.g., infrared wireless communication, radio communication, microwave wireless communication), among other possibilities.

In some embodiments, communication medium 702 may include one or more buses connecting pins of the hardware elements of computer system 700. For example, communication medium 702 may include a bus that connects processor(s) 704 with main memory 714, referred to as a system bus, and a bus that connects main memory 714 with input device(s) 706 or output device(s) 708, referred to as an expansion bus. The system bus may itself consist of several buses, including an address bus, a data bus, and a control bus. The address bus may carry a memory address from processor(s) 704 to the address bus circuitry associated with main memory 714 in order for the data bus to access and carry the data contained at the memory address back to processor(s) 704. The control bus may carry commands from processor(s) 704 and return status signals from main memory 714. Each bus may include multiple wires for carrying multiple bits of information and each bus may support serial or parallel transmission of data.

Processor(s) 704 may include one or more central processing units (CPUs), graphics processing units (GPUs), neural network processors or accelerators, digital signal processors (DSPs), and/or other general-purpose or special-purpose processors capable of executing instructions. A CPU may take the form of a microprocessor, which may be fabricated on a single IC chip of metal-oxide-semiconductor field-effect transistor (MOSFET) construction. Processor(s) 704 may include one or more multi-core processors, in which each core may read and execute program instructions concurrently with the other cores, increasing speed for programs that support multithreading.

Input device(s) 706 may include one or more of various user input devices such as a mouse, a keyboard, a microphone, as well as various sensor input devices, such as an image capture device, a pressure sensor (e.g., barometer, tactile sensor), a temperature sensor (e.g., thermometer, thermocouple, thermistor), a movement sensor (e.g., accelerometer, gyroscope, tilt sensor), a light sensor (e.g., photodiode, photodetector, charge-coupled device), and/or the like. Input device(s) 706 may also include devices for reading and/or receiving removable storage devices or other removable media. Such removable media may include optical discs (e.g., Blu-ray discs, DVDs, CDs), memory cards (e.g., CompactFlash card, Secure Digital (SD) card, Memory Stick), floppy disks, Universal Serial Bus (USB) flash drives, external hard disk drives (HDDs) or solid-state drives (SSDs), and/or the like.

Output device(s) 708 may include one or more of various devices that convert information into human-readable form, such as without limitation a display device, a speaker, a printer, a haptic or tactile device, and/or the like. Output device(s) 708 may also include devices for writing to removable storage devices or other removable media, such as those described in reference to input device(s) 706. Output device(s) 708 may also include various actuators for causing physical movement of one or more components. Such actuators may be hydraulic, pneumatic, electric, and may be controlled using control signals generated by computer system 700.

Communications subsystem 710 may include hardware components for connecting computer system 700 to systems or devices that are located external to computer system 700, such as over a computer network. In various embodiments, communications subsystem 710 may include a wired communication device coupled to one or more input/output ports (e.g., a universal asynchronous receiver-transmitter (UART)), an optical communication device (e.g., an optical modem), an infrared communication device, a radio communication device (e.g., a wireless network interface controller, a BLUETOOTH® device, an IEEE 802.11 device, a Wi-Fi device, a Wi-Max device, a cellular device), among other possibilities.

Memory device(s) 712 may include the various data storage devices of computer system 700. For example, memory device(s) 712 may include various types of computer memory with various response times and capacities, from faster response times and lower capacity memory, such as processor registers and caches (e.g., L0, L1, L2), to medium response time and medium capacity memory, such as random-access memory (RAM), to lower response times and lower capacity memory, such as solid-state drives and hard drive disks. While processor(s) 704 and memory device(s) 712 are illustrated as being separate elements, it should be understood that processor(s) 704 may include varying levels of on-processor memory, such as processor registers and caches that may be utilized by a single processor or shared between multiple processors.

Memory device(s) 712 may include main memory 714, which may be directly accessible by processor(s) 704 via the memory bus of communication medium 702. For example, processor(s) 704 may continuously read and execute instructions stored in main memory 714. As such, various software elements may be loaded into main memory 714 to be read and executed by processor(s) 704 as illustrated in FIG. 7. Typically, main memory 714 is volatile memory, which loses all data when power is turned off and accordingly needs power to preserve stored data. Main memory 714 may further include a small portion of non-volatile memory containing software (e.g., firmware, such as BIOS) that is used for reading other software stored in memory device(s) 712 into main memory 714. In some embodiments, the volatile memory of main memory 714 is implemented as RAM, such as dynamic random-access memory (DRAM), and the non-volatile memory of main memory 714 is implemented as read-only memory (ROM), such as flash memory, erasable programmable read-only memory (EPROM), or electrically erasable programmable read-only memory (EEPROM).

Computer system 700 may include software elements, shown as being currently located within main memory 714, which may include an operating system, device driver(s), firmware, compilers, and/or other code, such as one or more application programs, which may include computer programs provided by various embodiments of the present disclosure. Merely by way of example, one or more steps described with respect to any methods discussed above, may be implemented as instructions 716, which are executable by computer system 700. In one example, such instructions 716 may be received by computer system 700 using communications subsystem 710 (e.g., via a wireless or wired signal that carries instructions 716), carried by communication medium 702 to memory device(s) 712, stored within memory device(s) 712, read into main memory 714, and executed by processor(s) 704 to perform one or more steps of the described methods. In another example, instructions 716 may be received by computer system 700 using input device(s) 706 (e.g., via a reader for removable media), carried by communication medium 702 to memory device(s) 712, stored within memory device(s) 712, read into main memory 714, and executed by processor(s) 704 to perform one or more steps of the described methods.

In some embodiments of the present disclosure, instructions 716 are stored on a computer-readable storage medium (or simply computer-readable medium). Such a computer-readable medium may be non-transitory and may therefore be referred to as a non-transitory computer-readable medium. In some cases, the non-transitory computer-readable medium may be incorporated within computer system 700. For example, the non-transitory computer-readable medium may be one of memory device(s) 712 (as shown in FIG. 7). In some cases, the non-transitory computer-readable medium may be separate from computer system 700. In one example, the non-transitory computer-readable medium may be a removable medium provided to input device(s) 706 (as shown in FIG. 7), such as those described in reference to input device(s) 706, with instructions 716 being read into computer system 700 by input device(s) 706. In another example, the non-transitory computer-readable medium may be a component of a remote electronic device, such as a mobile phone, that may wirelessly transmit a data signal that carries instructions 716 to computer system 700 and that is received by communications subsystem 710 (as shown in FIG. 7).

Instructions 716 may take any suitable form to be read and/or executed by computer system 700. For example, instructions 716 may be source code (written in a human-readable programming language such as Java, C, C++, C#, Python), object code, assembly language, machine code, microcode, executable code, and/or the like. In one example, instructions 716 are provided to computer system 700 in the form of source code, and a compiler is used to translate instructions 716 from source code to machine code, which may then be read into main memory 714 for execution by processor(s) 704. As another example, instructions 716 are provided to computer system 700 in the form of an executable file with machine code that may immediately be read into main memory 714 for execution by processor(s) 704. In various examples, instructions 716 may be provided to computer system 700 in encrypted or unencrypted form, compressed or uncompressed form, as an installation package or an initialization for a broader software deployment, among other possibilities.

In one aspect of the present disclosure, a system (e.g., computer system 700) is provided to perform methods in accordance with various embodiments of the present disclosure. For example, some embodiments may include a system comprising one or more processors (e.g., processor(s) 704) that are communicatively coupled to a non-transitory computer-readable medium (e.g., memory device(s) 712 or main memory 714). The non-transitory computer-readable medium may have instructions (e.g., instructions 716) stored therein that, when executed by the one or more processors, cause the one or more processors to perform the methods described in the various embodiments.

In another aspect of the present disclosure, a computer-program product that includes instructions (e.g., instructions 716) is provided to perform methods in accordance with various embodiments of the present disclosure. The computer-program product may be tangibly embodied in a non-transitory computer-readable medium (e.g., memory device(s) 712 or main memory 714). The instructions may be configured to cause one or more processors (e.g., processor(s) 704) to perform the methods described in the various embodiments.

In another aspect of the present disclosure, a non-transitory computer-readable medium (e.g., memory device(s) 712 or main memory 714) is provided. The non-transitory computer-readable medium may have instructions (e.g., instructions 716) stored therein that, when executed by one or more processors (e.g., processor(s) 704), cause the one or more processors to perform the methods described in the various embodiments.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of exemplary configurations including implementations. However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Having described several example configurations, various modifications, alternative constructions, and equivalents may be used without departing from the spirit of the disclosure. For example, the above elements may be components of a larger system, wherein other rules may take precedence over or otherwise modify the application of the technology. Also, a number of steps may be undertaken before, during, or after the above elements are considered. Accordingly, the above description does not bind the scope of the claims.

As used herein and in the appended claims, the singular forms "a", "an", and "the" include plural references unless the context clearly dictates otherwise. Thus, for example, reference to "a user" includes reference to one or more of such users, and reference to "a processor" includes reference to one or more processors and equivalents thereof known to those skilled in the art, and so forth.

Also, the words "comprise," "comprising," "contains," "containing," "include," "including," and "includes," when used in this specification and in the following claims, are intended to specify the presence of stated features, integers, components, or steps, but they do not preclude the presence or addition of one or more other features, integers, components, steps, acts, or groups.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A computer-implemented method of reducing a set of parameters for testing a device, the computer-implemented method comprising:
   receiving a set of test values and limits for the set of parameters, the set of test values having been obtained from testing a set of training devices;
   determining a set of simulated test values for the set of parameters based on one or more probabilistic representations for the set of parameters, the one or more probabilistic representations having been constructed based on the set of test values, wherein the one or more probabilistic representations include correlations between the set of parameters, and wherein the set of simulated test values are determined based on the correlations between the set of parameters;
   calculating a set of cumulative probabilities of passing for the set of parameters based on the set of simulated test values and the limits;
   determining a reduced set of parameters from the set of parameters based on the set of cumulative probabilities of passing; and
   deploying the reduced set of parameters for testing the device.

2. The computer-implemented method of claim 1, wherein the limits include one or both of a lower limit and an upper limit for each of the set of parameters.

3. The computer-implemented method of claim 2, further comprising:
   normalizing the set of test values based on the limits.

4. The computer-implemented method of claim 3, wherein normalizing the set of test values includes modifying the set of test values to convert the lower limit to −1 and the upper limit to 1 for each of the set of parameters.

5. The computer-implemented method of claim 1, further comprising:
   scaling the one or more probabilistic representations by multiplying a standard deviation associated with the one or more probabilistic representations by a scaling factor while maintaining a mean associated with the one or more probabilistic representations constant.

6. The computer-implemented method of claim 1, wherein the one or more probabilistic representations include a multivariate Gaussian distribution.

7. The computer-implemented method of claim 1, wherein a quantity of the set of simulated test values is greater than a quantity of the set of test values.

8. The computer-implemented method of claim 1, further comprising:
   calculating a set of incremental probabilities of passing for the set of parameters based on the set of cumulative probabilities of passing, wherein the reduced set of parameters is determined based on the set of incremental probabilities of passing.

9. The computer-implemented method of claim 8, wherein determining the reduced set of parameters includes arranging the set of parameters in descending or ascending order based on the incremental probabilities of passing.

10. A non-transitory computer-readable medium comprising instructions that, when executed by one or more processors, cause the one or more processors to perform operations comprising:
    receiving a set of test values and limits for a set of parameters, the set of test values having been obtained from testing a set of training devices;
    determining a set of simulated test values for the set of parameters based on one or more probabilistic representations for the set of parameters, the one or more probabilistic representations having been constructed based on the set of test values, wherein the one or more probabilistic representations include correlations between the set of parameters, and wherein the set of simulated test values are determined based on the correlations between the set of parameters;
    calculating a set of cumulative probabilities of passing for the set of parameters based on the set of simulated test values and the limits;
    determining a reduced set of parameters from the set of parameters based on the set of cumulative probabilities of passing; and
    deploying the reduced set of parameters for testing a device.

11. The non-transitory computer-readable medium of claim 10, wherein the limits include one or both of a lower limit and an upper limit for each of the set of parameters.

12. The non-transitory computer-readable medium of claim 11, wherein the operations further comprise:
    normalizing the set of test values based on the limits.

13. The non-transitory computer-readable medium of claim 12, wherein normalizing the set of test values includes modifying the set of test values to convert the lower limit to −1 and the upper limit to 1 for each of the set of parameters.

14. The non-transitory computer-readable medium of claim 11, wherein the operations further comprise:
    scaling the one or more probabilistic representations by multiplying a standard deviation associated with the one or more probabilistic representations by a scaling factor while maintaining a mean associated with the one or more probabilistic representations constant.

15. The non-transitory computer-readable medium of claim 10, wherein the one or more probabilistic representations include a multivariate Gaussian distribution.

16. The non-transitory computer-readable medium of claim 10, wherein a quantity of the set of simulated test values is greater than a quantity of the set of test values.

17. The non-transitory computer-readable medium of claim 10, wherein the operations further comprise:
    calculating a set of incremental probabilities of passing for the set of parameters based on the set of cumulative probabilities of passing, wherein the reduced set of parameters is determined based on the set of incremental probabilities of passing.

18. The non-transitory computer-readable medium of claim 17, wherein determining the reduced set of parameters includes arranging the set of parameters in descending or ascending order based on the incremental probabilities of passing.

19. A computer-implemented method of determining that a parameter in a set of parameters for testing a device is redundant, the computer- implemented method comprising:
  receiving a set of test values and limits for the set of parameters, the set of test values having been obtained from testing a set of training devices;
  determining a set of simulated test values for the set of parameters based on one or more probabilistic representations for the set of parameters, the one or more probabilistic representations having been constructed based on the set of test values, wherein the one or more probabilistic representations include correlations between the set of parameters, and wherein the set of simulated test values are determined based on the correlations between the set of parameters;
  calculating a set of cumulative probabilities of passing for the set of parameters based on the set of simulated test values and the limits, the set of cumulative probabilities of passing including a first cumulative probability for the parameter and a second cumulative probability for a previous parameter that precedes the parameter in the set of parameters;
  calculating an incremental probability between the first cumulative probability and the second cumulative probability; and
  in response to determining that the incremental probability is below a threshold, determining that the parameter is redundant.

20. The computer-implemented of claim 19, further comprising:
  determining a reduced set of parameters from the set of parameters, the reduced set of parameters not including the parameter; and
  deploying the set of parameters for testing the device.